United States Patent
Li

(10) Patent No.: US 7,767,563 B2
(45) Date of Patent: Aug. 3, 2010

(54) METHOD OF FORMING A SILICIDE LAYER ON A THINNED SILICON WAFER, AND RELATED SEMICONDUCTING STRUCTURE

(75) Inventor: Eric J. Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 575 days.

(21) Appl. No.: 11/726,284

(22) Filed: Mar. 21, 2007

(65) Prior Publication Data

US 2008/0230911 A1 Sep. 25, 2008

(51) Int. Cl.
*H01L 21/28* (2006.01)
*H01L 21/44* (2006.01)
*H01L 21/336* (2006.01)

(52) U.S. Cl. .................. 438/572; 438/612; 438/614
(58) Field of Classification Search .......... 438/572, 438/612, 614
See application file for complete search history.

(56) References Cited

U.S. PATENT DOCUMENTS

| | | | | |
|---|---|---|---|---|
| 6,124,179 | A * | 9/2000 | Adamic, Jr. | 438/309 |
| 6,548,386 | B1 * | 4/2003 | Kondo et al. | 438/572 |
| 7,012,011 | B2 * | 3/2006 | Chrysler et al. | 438/455 |

* cited by examiner

*Primary Examiner*—Fernando L Toledo
(74) *Attorney, Agent, or Firm*—Kenneth A. Nelson

(57) ABSTRACT

A semiconducting structure includes a thinned silicon substrate (110), a silicide layer (120) over the thinned silicon substrate, a metal layer (130) over the silicide layer, a solder interface layer (140) over the metal layer, and a cap layer (150) over the solder interface layer. The thinned silicon substrate is no thicker than approximately 500 micrometers. The silicide layer is formed using a rapid thermal processing procedure that locally heats the interface between the metal layer and the silicon substrate but causes no more than negligible thermal impact to other areas of the silicon wafer.

7 Claims, 2 Drawing Sheets

METHOD OF FORMING A SILICIDE LAYER ON A THINNED SILICON WAFER, AND RELATED SEMICONDUCTING STRUCTURE

FIELD OF THE INVENTION

The disclosed embodiments of the invention relate generally to thin die thin thermal interface material (TDTT) process flows, and relate more particularly to silicide formation to improve backside metallization film adhesion to the backside surface of a thinned wafer.

BACKGROUND OF THE INVENTION

In the TDTT die prep process flow, a full thickness silicon wafer (approximately 700 micrometers (µm) thick) is mounted onto a semi-rigid backgrinding (BG) tape and thinned to some fraction of its original thickness. The thinned wafer with the BG tape is then sent to a backside metallization (BSM) module for sputtering deposition of a film stack typically comprising materials such as titanium (Ti), nickel-vanadium (NiV), and gold (Au). Because the glass transition temperature ($T_g$) of a BG tape is relatively low—approximately 90 degrees Celsius (° C.)—the thermal budget during BSM deposition must be carefully controlled.

During the thin-wafer BSM process, the wafer has to go through a low temperature degas process to remove surface moisture and then a sputter etch process to remove other remaining contaminations on the wafer surface. However, at wafer thinning a fresh silicon surface is exposed to the ambient environment and a thin native oxide layer is formed. During the sputter etch process, this native oxide layer will be removed easily and completely, resulting in a fresh silicon surface. Unfortunately, the adhesion of Ti to pure silicon is very poor, and the as-deposited BSM film stack will peel off in the downstream processes, i.e., saw, tape reel and die sort (TRDS), deflux, etc.

It is well known that the interface adhesion between Ti and silicon (Si) can be improved dramatically by forming Ti silicide. However, Ti won't react with Si to form Ti silicide unless it is exposed to a temperature above 600° C., which is incompatible with wafer backend and assembly processes. Accordingly, there exists a need for a method of forming a silicide layer (whether composed of Ti silicide or a different silicide, as determined according to the materials being used) that is compatible with the thermal budget of a TDTT process flow.

BRIEF DESCRIPTION OF THE DRAWINGS

The disclosed embodiments will be better understood from a reading of the following detailed description, taken in conjunction with the accompanying figures in the drawings in which.

Figure 1:
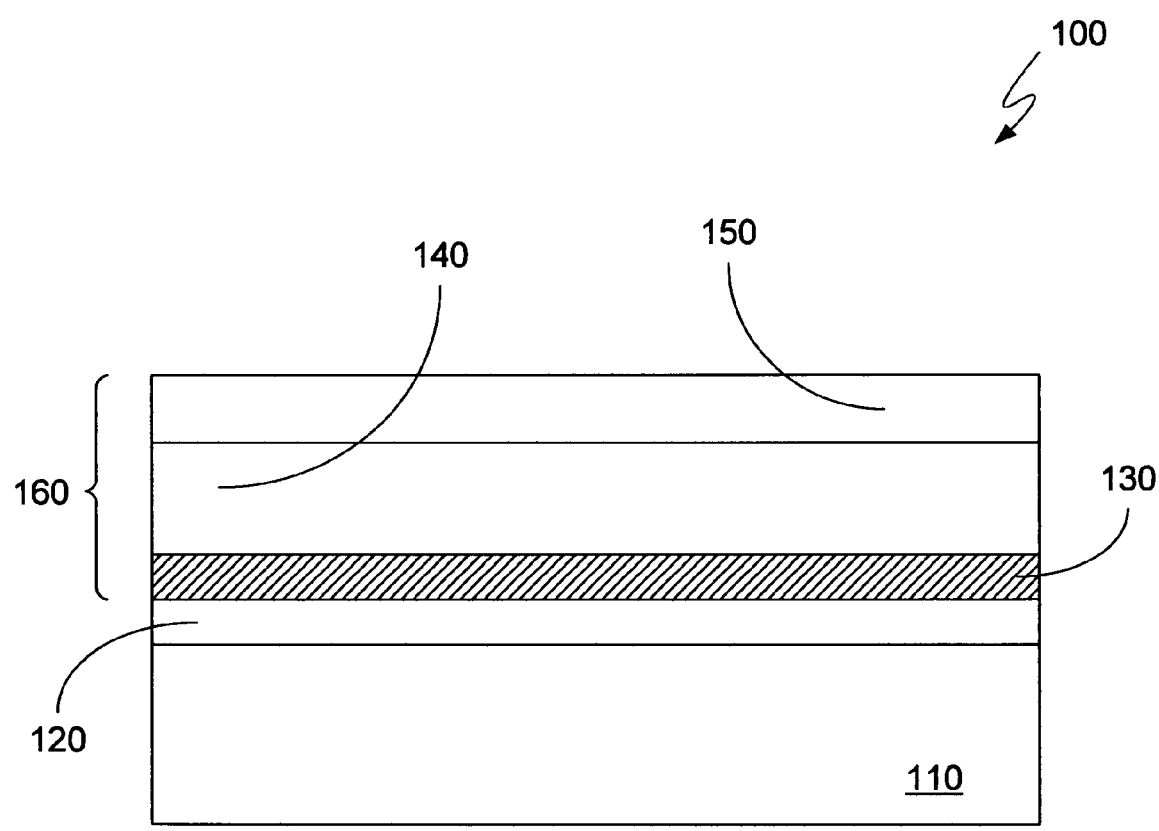
FIG. 1 is a cross-sectional view of a semiconducting structure according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a semiconducting structure comprises a thinned silicon substrate, a silicide layer over the thinned silicon substrate, a metal layer over the silicide layer, a solder interface layer over the metal layer, and a cap layer over the solder interface layer. The thinned silicon substrate is no thicker than approximately 500 micrometers. The silicide layer is formed using a rapid thermal processing procedure that locally heats the interface between the metal layer and the silicon substrate but causes no more than negligible thermal impact to other areas of the silicon wafer.

Referring now to the figures, FIG. 1 is a cross-sectional view of a semiconducting structure 100 according to an embodiment of the invention. As illustrated in FIG. 1, semiconducting structure 100 comprises a thinned silicon substrate 110, a silicide layer 120 over thinned silicon substrate 110, a metal layer 130 over silicide layer 120, a solder interface layer 140 over metal layer 130, and a cap layer 150 over solder interface layer 140. Metal layer 130, solder interface layer 140, and cap layer 150 together comprise a BSM stack 160.

Silicide is a compound in which silicon is combined with another element such as titanium, tungsten, sodium, magnesium, or the like. Of these, titanium is commonly used in semiconductor processing, and will therefore be frequently mentioned at times in the following discussion in places where the other materials could possibly be used as well.

Thinned wafers are used in semiconductor packages at least in part for their ability to transfer heat through their thickness. This ability allows the heat to be delivered to a position from which it can be removed from the package, and to do so more easily and efficiently than is the case with a full-thickness wafer. Standard wafer processing leaves on the wafer surface a layer of silicon oxide (e.g., silicon dioxide ($SiO_2$) or the like), a layer of silicon nitride (e.g., ($Si_3N_4$) or the like), an oxy-nitride layer, a multi-layer of oxide, nitride, and/or oxy-nitride, or a similar layer. All of these layers exhibit at least reasonable adhesion with the titanium of the BSM stack. As mentioned above, however, the wafer thinning process removes these layers and leaves a wafer having a pure silicon surface to which titanium will not adhere. Furthermore, although a new oxide or nitride or similar layer could be grown on the pure silicon surface, such growth would require temperatures (600° C. or more) that far exceed the thermal budget of the thinned wafer structure.

Thinned silicon substrate 110 is no thicker than approximately 500 micrometers, and in a particular embodiment is no thicker than approximately 200 to 300 micrometers. In the same or another embodiment, metal layer 130 comprises titanium and silicide layer 120 comprises titanium silicide ($TiSi_2$). Solder interface layer 140 can be made up of any material to which a solder thermal interface material (TIM) can attach, and in one embodiment comprises nickel. In another embodiment solder interface layer 140 comprises both nickel and vanadium. Cap layer 150 can be made up of any material that prevents oxidation and is compatible with other materials used in semiconducting structure 100, as, for example, gold, platinum, silver, or some other noble metal. (The "noble metals" are considered herein to include any of the metals that are resistant to oxidation, and thus include platinum and other metals that are not considered noble metals under the stricter definition that requires that the d-bands of the material's electronic structure to be filled.)

Figure 2:
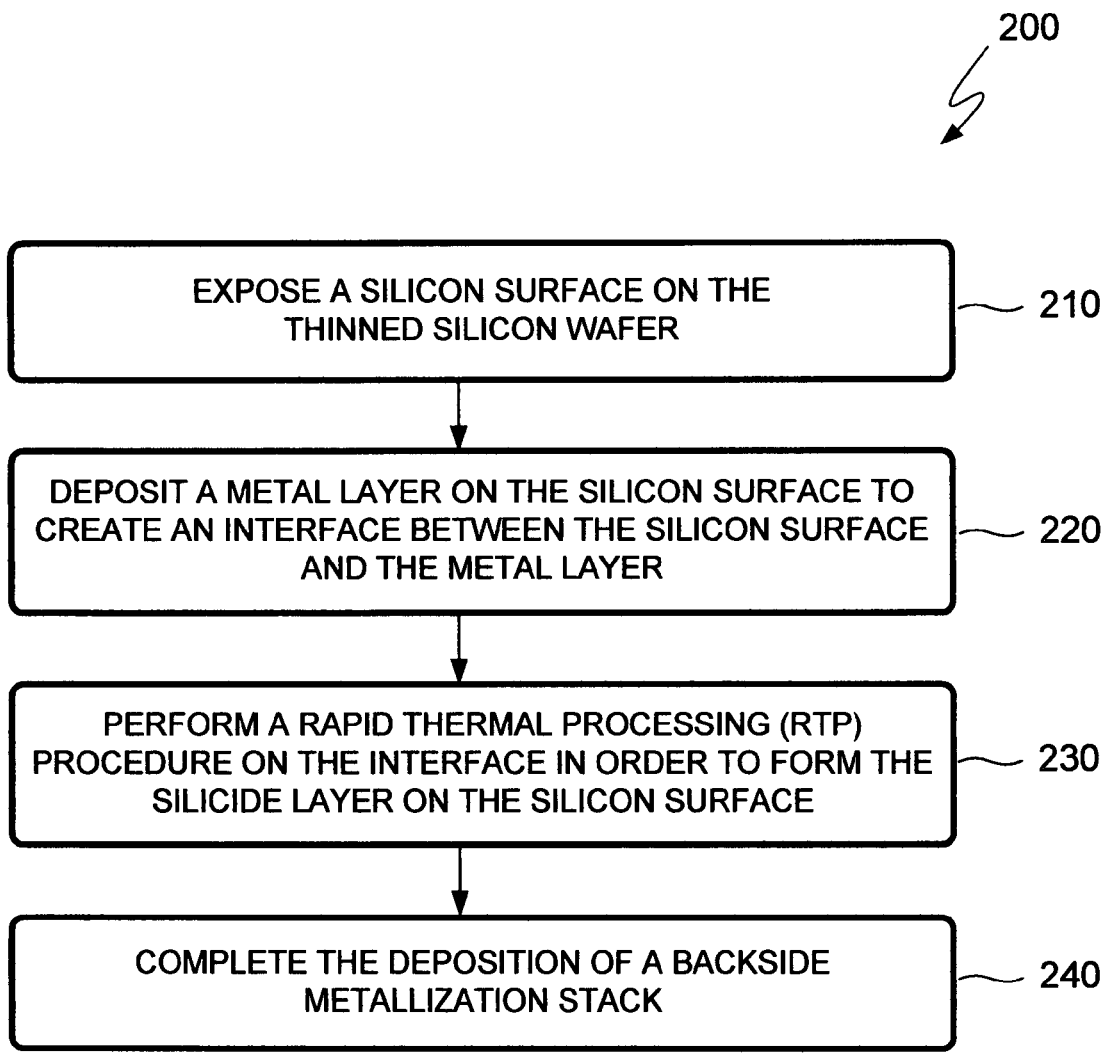
FIG. 2 is a flowchart illustrating a method of forming a silicide layer on a thinned silicon wafer according to an embodiment of the invention.

FIG. 2 is a flowchart illustrating a method 200 of forming a silicide layer on a thinned silicon wafer according to an embodiment of the invention. As an example, the thinned silicon wafer can be similar to thinned silicon substrate 110 and the silicide layer can be similar to silicide layer 120, both of which are shown in FIG. 1. A step 210 of method 200 is to expose a silicon surface on the thinned silicon wafer.

In one embodiment, step 210 is performed by mounting a full thickness silicon wafer on a BG tape and thinning it (e.g., by grinding or polishing or the like) to about 200-300 μm. The thinned wafer is then cleaned and dried. With the BG tape still on the active side, the thinned wafer is loaded into a thin wafer BSM tool, at which point a low temperature ($T_{max}$<90° C.) degas process is used to remove any residue moisture content on the wafer surface. Next, a sputter etch process is used to remove any other contaminations on the wafer surface. Since the native oxide formation after wafer thinning is a self limiting process, the native oxide thickness is on the order of only 1-3 nm and will be completely removed after the sputter etch process, thus exposing the pure silicon surface.

A step 220 of method 200 is to deposit a metal layer on the silicon surface, after which an interface is formed between the silicon surface and the metal layer. As an example, the metal layer can be similar to metal layer 130 that was shown in FIG. 1. Accordingly, in one embodiment the metal can be titanium. In that embodiment, step 220 can comprise transferring the silicon wafer (without breaking vacuum) from the sputter etch chamber to a Ti sputtering chamber and depositing a thin Ti film on the exposed pure silicon surface. The thickness of the Ti film will be determined during process development, taking into account at least: (a) that it has to provide a uniform and continuous surface coverage with no pin-holes; (b) whether the Ti film will be deposited in one step or two, as further discussed below; and (c) that if the Ti film is to be deposited in two steps, the first portion of the film (the portion that is deposited first) should be as thin as possible.

A step 230 of method 200 is to perform a rapid thermal processing (RTP) procedure on the interface in order to form the silicide layer on the silicon surface. In one embodiment, step 230 comprises using a laser to heat the interface. The wavelength of the laser system is selected so that it has reasonable optical absorption in Ti. As a metallic thin film, Ti is highly reflective. However, because the film thickness is very small, even a small absorption will be more than enough. For example, a neodymium-doped yttrium aluminum garnet (Nd: YAG) laser system with a wavelength of 1064 nm should be sufficient. Pulsed laser systems can be used but it is very possible that a continuous wave (CW) laser can provide enough optical energy for Ti silicide formation.

In one embodiment a focused laser beam is used to locally heat up the interface between Ti and Si so as to reach a temperature of 600° C. or greater that is necessary for Ti silicide formation. The heating effect is limited to a few nanometers in the direction perpendicular to the wafer surface, and the total optical energy is minimal due to the small volume. The thermal impact to the other areas of the silicon wafer, i.e., to the front side of the wafer and to the BG tape, is negligible, and the Ti silicide formation on the wafer backside can be achieved well within the thermal budget needed. After the Ti silicide is formed at the Ti—Si interface, the remaining BSM film stack is deposited on top of that with significantly improved adhesion—quite possibly the best adhesion theoretically possible.

The laser RTP procedure of step 230 can be performed under any inert environment or in vacuum. In one embodiment, as noted, step 230 is performed using a Nd:YAG laser. In the same or another embodiment, step 230 further comprises using a galvo optical system in which a laser beam from the laser is focused onto and moved across the backside wafer surface by a set of fast scanning mirrors and an f-theta focusing lens. In other embodiments another laser scanning system may be used to focus the laser beam onto the silicon surface and to move the laser beam across the silicon surface. If necessary, the wafer can be mounted onto an electro-static chuck (ESC) for front side cooling during the laser RTP procedure. However, due to the localized nature of the RTP procedure, this action may not be necessary.

$TiSi_2$ formation is typically achieved using two RTP procedures in a nitrogen environment: (1) Ti+2Si→$TiSi_2$ (C-49); and (2) $TiSi_2$(C-49)→$TiSi_2$ (C-54). The first RTP procedure is done at a temperature of approximately 600-680° C., and the second RTP procedure is done at a temperature above approximately 750° C. In the second RTP procedure, the high resistive and metastable C-49 phase of $TiSi_2$ is transformed to the low resistive, stable, and orthogonal C-54 phase. (The C-54 phase is preferred in some embodiments because the resistivity of C-49 is about three to four times higher than the resistivity for C-54.)

Pulsed laser ablation of various materials including metallic elements such as Ti, copper (Cu), and Au is a common practice in the industry. Ti has a melting temperature of 1668° C. and a boiling temperature of 3287° C. The fact that a focused laser beam can ablate metallic materials like Ti rather easily means that it requires much less optical energy to heat the Ti—Si interface above 600° C. In fact, as noted above, a CW laser, instead of a pulsed laser, can locally heat up the interface easily to above 750° C. when direct formation of C-54 phase $TiSi_2$ is possible.

A step 240 of method 200 is to complete the deposition of a backside metallization stack. As an example, the backside metallization stack can be similar to BSM stack 160 that was shown in FIG. 1. In one embodiment, step 240 comprises depositing a solder interface layer over the silicide layer and depositing a cap layer over the solder interface layer. As an example, the solder interface layer and the cap layer can be similar to, respectively, solder interface layer 140 and cap layer 150, both of which are shown in FIG. 1.

In one embodiment of method 200, step 220 comprises depositing a first portion of the titanium film prior to performing the RTP procedure and further comprises depositing a second portion of the titanium film after performing the RTP procedure. In this embodiment, the first portion of the titanium film is deposited on the wafer in a Ti sputtering chamber as described above and then, without breaking vacuum, the wafer may be transferred to a different chamber where a laser scanning system is located. As an example, the laser scanning system can be a galvo optical system as described above. The laser heats the wafer (silicon) surface as well as the first portion of the Ti film to a temperature sufficient to form a Ti silicide layer. After the Ti silicide formation is completed, the wafer may be transferred back to the Ti deposition chamber and the second portion of the titanium film is deposited to an appropriate thickness, e.g., 40-50 nm, onto the Ti silicide surface. The second portion of the titanium film thus becomes the base layer of the BSM film stack. After the Ti silicide formation and subsequently the Ti thin film deposition, the wafer may be transferred to the NiV and Au sputtering chambers to complete the in situ BSM film stack deposition process.

Alternatively, the wafer can stay in the Ti sputtering chamber during the entire RTP procedure. In that case, a laser beam may be focused onto and moved across the backside wafer surface by a galvo optical system or other laser scanning system from the side of the chamber at an angle. As an example, in order to avoid mirror and lens contamination, the laser scanning system may be located outside the vacuum chamber and the laser beam may enter the chamber through a quartz window. Furthermore, an automatically controlled shutter may be placed just inside the quartz window in the vacuum chamber so as to keep the window contamination free. After Ti silicide formation is completed, the sputtering deposition of the second portion of the titanium film (e.g., approximately 40-50 nm) is resumed. As before, after the Ti silicide formation and subsequently the Ti thin film deposition, the wafer may be transferred to the NiV and Au sputtering chambers to complete the in situ BSM film stack deposition process.

In a different embodiment of method 200, step 220 comprises depositing all of the titanium film prior to performing the RTP procedure. In this embodiment the goal of the laser RTP process is to locally heat up the Ti film to the extent that sufficient Ti silicide formation occurs at the Ti—Si interface, but in the meantime to control the laser RTP duration so that a desired and well controlled thickness of Ti silicide is formed, on top of which sufficient pure Ti film still remains, resulting in a Si—$TiSi_2$—Ti stack. In this embodiment the throughput will likely be higher than the embodiment described previously since the Ti deposition is completed in one step instead of two. After the Ti thin film deposition and the Ti silicide formation, the wafer may be transferred to the NiV and Au sputtering chambers to complete the in situ BSM film stack deposition process.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconducting structure and related methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of forming a silicide layer on a thinned silicon wafer, the method comprising:
   exposing a silicon surface on the thinned silicon wafer;
   depositing a metal layer on the silicon surface to create an interface between the silicon surface and the metal layer;
   performing a rapid thermal processing procedure on the interface in order to form the silicide layer on the silicon surface; and
   completing a deposition of a backside metallization stack, wherein depositing the metal layer comprises:
      depositing a first portion of the metal layer prior to performing the rapid thermal processing procedure; and
      depositing a second portion of the metal layer after performing the rapid thermal processing procedure.

2. The method of claim 1 wherein:
depositing the metal layer comprises depositing a titanium layer.

3. The method of claim 2 wherein:
depositing the titanium layer comprises depositing all of the titanium layer prior to performing the rapid thermal processing procedure.

4. The method of claim 1 wherein:
performing the rapid thermal processing procedure comprises using a laser to heat the interface.

5. The method of claim 4 wherein:
performing the rapid thermal processing procedure comprises using a neodymium-doped yttrium aluminum garnet laser.

6. The method of claim 4 wherein:
performing the rapid thermal processing procedure further comprises using a galvo optical system to focus a laser beam emitted by the laser onto the silicon surface and to move the laser beam across the silicon surface.

7. The method of claim 1 wherein:
completing the deposition of the backside metallization stack comprises:
   depositing a solder interface layer over the silicide layer; and
   depositing a cap layer over the solder interface layer.

* * * * *